March 20, 1962 J. J. SURAN 3,026,485
UNIJUNCTION RELAXATION OSCILLATOR WITH TRANSISTOR, IN DISCHARGE CIRCUIT OF CHARGE CAPACITOR, FOR COUPLING DISCHARGE TO OUTPUT CIRCUIT
Filed Dec. 7, 1959

INVENTOR:
JEROME J. SURAN,
BY Richard V. Lang
HIS ATTORNEY.

United States Patent Office 3,026,485
Patented Mar. 20, 1962

3,026,485

UNIJUNCTION RELAXATION OSCILLATOR WITH TRANSISTOR, IN DISCHARGE CIRCUIT OF CHARGE CAPACITOR, FOR COUPLING DISCHARGE TO OUTPUT CIRCUIT

Jerome J. Suran, Syracuse, N.Y., assignor to General Electric Company, a corporation of New York Filed Dec. 7, 1959, Ser. No. 857,748
7 Claims. (Cl. 331—108)

Figure 1:
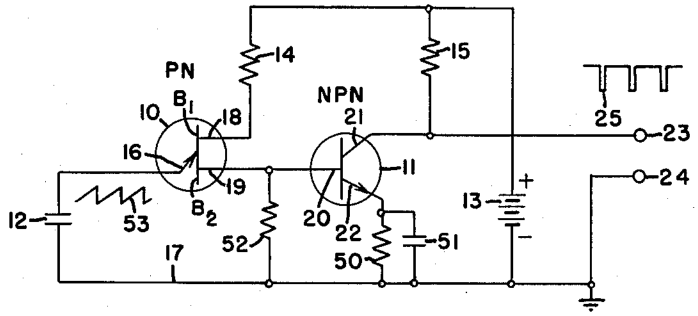

The present invention relates to wave generators employing semiconductors and in particular to wave generators employing semiconductors of the unijunction variety.

The unijunction transistor is described in detail in the U.S. Patent 2,769,926 of I. A. Lesk entitled "Non-Linear Resistance Device," assigned to the General Electric Company. Briefly, the unijunction transistor may be described as having an elongated semiconductor body with a bilaterally conducting electrode or base at either extremity, and a rectifying junction intermediate the ends thereof. In normal operation, a unidirectional bias is applied between the bilaterally conducting electrodes, and the junction electrode is biased at a potential intermediate to the inter-base potentials. The precise operating potential is usually selected to provide operation in the region of the potential at which the voltage at the junction boundary is near zero, a condition providing minimum current at the junction. This is the region of greatest non-linearity. If now the potential of the junction electrode is varied to provide a greater reverse bias as by the application of a signal voltage, relatively little additional current flows through the device, and it presents a relatively high impedance both to the inter-base bias source as well as to the signal source coupled in circuit with the junction. If, however, the signal source provides a slightly forward bias to the junction, holes or electrons (depending on whether the device is a PN or NP type device) injected into the bar suddenly lower the impedance of the device in the portion of the bar between the junction and the base in the easy flow direction. The sudden drop of impedance causes a large and sudden increase in current both through the junction as well as between the bases.

An examination of the characteristics of the unijunction transistor shows that the input voltage versus output current characteristic is N shaped, having a negative resistance region, adapting the device for application to many kinds of switching and wave generation circuits. This property has been recognized in the past and one typical application of the unijunction transistor to wave generation circuits is shown in the U.S. Patent 2,801,340 of E. Keonjian entitled "Semiconductor Wave Generator," assigned to the General Electric Company. These circuits are characterized by great circuit simplicity.

When used in pulse generating circuits, the unijunction device has a high maximum conductivity. Since the conductivity is readily switched on and off, the device is admirably suited for use in many types of oscillator circuits wherein, for example, a capacitor is recurrently discharged by means of the unijunction device. In this application, the low impedance of the unijunction transistor permits one to effect a rapid discharge of the capacitor and to achieve extremely high rise times in the output waveform. In addition, one can produce output pulses in circuits of considerable simplicity, having both moderately high repetition rates and high energy content.

The efficient utilization of the unijunction output may sometimes present problems since the very factors which make it a desirable component in a pulse generator tend to complicate the problem of effective output utilization. In particular, the unijunction transistor best operates with a moderately low load impedance if efficient output coupling is desired. If the output device is connected in a capacitor discharge path, it should also have a low impedance so as to not affect the sharpness of the generated output pulses. As a final factor, it should be recognized that the unijunction transistor best functions when there is appreciable isolation between itself and the ultimate load, since changes in the condition of the load may adversely affect the operating point of the unijunction device.

The present invention has as a principal object thereof the provision of a novel wave generator utilizing a unijunction device in a circuit providing a solution to the foregoing operating requirements.

It is a further object of the present invention to provide an improved wave generator employing a unijunction transistor.

It is another object of the present invention to provide a novel wave generator employing a unijunction transistor wherein pulses having relatively fast rise times are generated and efficiently coupled load devices of moderate impedances.

It is a further object of the present invention to provide a novel wave generator employing a unijunction transistor wherein the unijunction transistor is matched to the load impedance while being effectively isolated from changes in the load impedance.

These and other objects are achieved in accordance with the present invention by the use in a wave generation circuit employing a unijunction transistor adapted to provide a discharge path for a capacitor which is recurrently charged, of a junction transistor whose input junction is connected in the easy flow direction in the path of said capacitor discharge. The interposition of the input junction of the transistor into the discharge circuit of the capacitor provides a minimum increase in the impedance in the discharge path thus favoring rapid rise times in the discharge of the capacitor, while at the same time providing by virtue of the normal action of the transistor both an impedance transformation and an amplification of the waveform generated by the unijunction device. This connection also provides effective isolation between the ultimate load device and the unijunction transistor.

The novel features which are believed to characterize the invention are set forth with particularity in the appended claims. The invention itself, however, together with further objects and advantages thereof can best be understood by reference to the following description when taken in connection with the accompanying drawings in which:

FIGURE 1 is a circuit diagram of a wave generator in which a PN type unijunction transistor and an NPN type junction transistor are combined to generate a sequence of negative going pulses.

Figure 2:
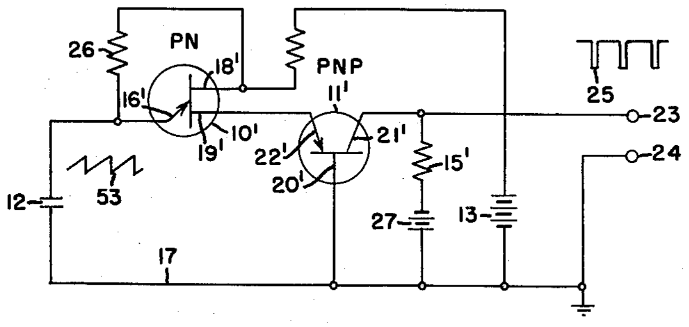
Figure 3:
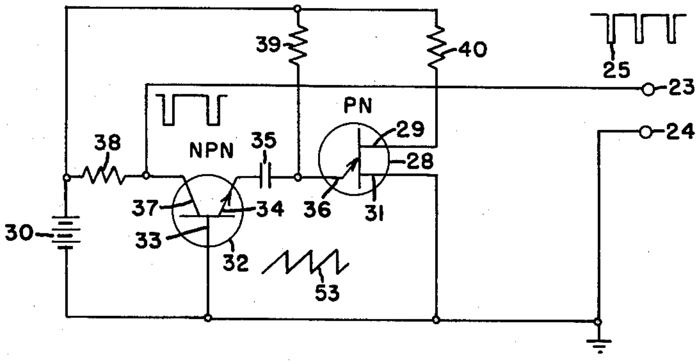

FIGURE 2 is an electrical circuit diagram of a wave generator employing a PN type unijunction transistor in combination with a PNP type junction transistor for the generation of negative going pulses; and FIGURE 3 is an electrical circuit diagram of a wave generator employing a PN type unijunction transistor and an NPN type junction transistor coupled to the junction terminal of the unijunction device for generation of a sequence of negative going pulses.

A pulse oscillator built in accordance with the present invention is shown in FIGURE 1. It has as its principal components a PN unijunction device 10, an NPN junction transistor 11, a capacitor 12, and a battery 13 which supplies energization for the unijunction device 10 by a path including a resistor 14 and which supplies energization for the transistor 11 by a path including a resistor 15.

The foregoing components are interconnected in the following manner. The rectifying junction terminal 16 of the unijunction device 10 is coupled to one terminal of the capacitor 12. The other terminal of capacitor 12 is connected to the ground bus 17. The ohmic connection or base 18 of the unijunction device 10 is coupled through the resistor 14 to the ungrounded positive terminal of the source 13. The negative terminal of the source 13 is coupled to the ground bus 17. The other ohmic connection or base 19 of the unijunction device is coupled to the base electrode 20 of the junction transistor 11. The collector 21 of the transistor 11 is connected through the resistor 15 to the positive terminal of the battery 13. The emitter 22 of the transistor 11 is connected to the ground bus 17 through a current stabilizing resistor 50 bypassed by a capacitor 51 having a low impedance for the output waves. In addition, a resistor 52 is provided connected between the transistor base 20 and the ground bus 17. The resistor 52 has an impedance usually somewhat higher than the forward impedance of the transistor input junction but substantially less than the backward impedance of the transistor input junction so as to stabilize the load on the unijunction device as between periods when no pulse is being produced and those periods when a pulse is being produced. The pulse output waveform of the foregoing circuit is derived between the collector electrode 21 of the transistor 11 and the ground bus 17, these elements being connected respectively to the output terminals 23 and 24.

The foregoing waveform generator provides an output waveform of the type generally illustrated at 25 in FIGURE 1. It may be seen to consist of a regularly spaced sequence of relatively high amplitude negative going pulses having relatively steep leading and trailing edges.

The circuit functions as follows. Assuming that the circuit is quiescent, the capacitor 12 is initially in an uncharged condition. When the circuit is turned on, as by the activation of the source 13, a charging current flows from the positive terminal of the source 13 through the resistor 14, through the ohmic contact 18 and reversely through the unijunction junction to the capacitor 12. The voltage across the capacitor 12 is plotted at 53 as a function of time. The charging continues until the capacitor 12 attains a voltage exceeding the potential at which the unijunction junction is forward biased. At this point firing or breakdown of the unijunction transistor 10 occurs and the capacitor 12 is discharged through a path including the junction terminal 16 (the junction now conducting in the forward direction), the ohmic contact 19 and the input junction (also conducting forwardly) of the transistor 11, and the capacitor 51 to ground. At the same time a substantial increase in inter-base current occurs from the reduction in inter-base impedance under the influence of the bias source 13. It pursues the same path to ground through base 19 as the capacitor discharge current. At the moment of discharge of the capacitor 12, the current flowing from the ohmic contact 19 and into the base 20 of the transistor 11 is amplified by transistor action and appears at the collector of the transistor 21 causing the output waveforms indicated at 25.

Several observations with respect to the operation of the embodiment of FIGURE 1 may be made. If a silicon type unijunction device is employed, the back resistance of the junction is usually too high to provide sufficiently rapid charging of capacitor 12. In that event a resistance is coupled between the junction terminal 16 and base 18 or to the positive terminal of source 13, to hasten the charging rate of capacitor 12. The pulse repetition rate of the waveform generator is primarily determined by the time constant of this capacitor charging circuit.

During the initial period when the capacitor 12 is charging, a small current persists between the bases 18 and 19 and thus is applied to the input circuit of the transistor 11. The resistor 52 shunts the major portion of this current to ground so that little of it passes into the transistor whose input junction is reversely poled. The resistor 50, on the other hand, tends to establish a predetermined amount of transistor output conduction and thus to stabilize the collector at a preselected voltage level. At the moment of unijunction breakdown, the current applied to the transistor base 20 increases suddenly, usually driving the transistor into saturation. When the capacitor 12 is finally discharged to the point wherein the unijunction becomes essentially non-conductive, the current is terminated quite suddenly also. In the output of the transistor, accordingly, the pulses are steep, and are negative going, descending from the voltage level established at the collector by the associated resistors.

The steepness of the sides of the pulses in the output waveform is independent of the charging rate of the capacitor 12, being primarily limited by the impedance in the discharge path for the capacitor. The unijunction device when fired presents a low impedance to the capacitor discharge, as does the forwardly biased input junction of the transistor 11. The transistor input junction thus provides a highly satisfactory load since it is of sufficiently low impedance to provide a minimum slowing of the capacitor discharge rate. The transistor 11 in base input configuration has the further advantage of providing current and voltage amplification of the unijunction output pulse and of isolating the unijunction device from reflected load impedances. The foregoing interconnection of a unijunction transistor and a junction transistor thus provide an unusually effective working combination for wave generation.

The connection of the low impedance forward conducting junction of the transistor 11 into the discharge path of the capacitor 12 for output coupling has, as mentioned above, the principal advantage of permitting a very rapid discharge of the capacitor 12, thus permitting the overall circuit to operate at very short rise times. In practical embodiments of the invention, employing a circuit similar to that illustrated in FIGURE 1, a pulse repetition rate of from 0 to 100 kc. is obtainable with pulse widths of less than 10 microseconds and rise times of approximately 0.5 microsecond. In embodiments employing a 4.5 volt battery, an output pulse magnitude of approximately 2.5 volts is obtained.

Suitable components and circuit parameters are as follows:

10—PN unijunction transistor 2N491, germanium
11—NPN transistor 2N168
12—0.1 microfarad capacitor
13—10 volts
14—330 ohms
15—1000 ohms
50—500 ohms
51—0.01 microfarads
52—1000 ohms In FIGURE 2 a second pulse oscillator circuit is illustrated employing a PN unijunction transistor in combination with a transistor. In this figure the unijunction transistor is of the silicon variety. In order to provide the required capacitor charging current, in view of the high back resistance of silicon type unijunction devices, an additional resistor 26 is provided connected in shunt between the base 18′ of the unijunction device 10′ and its junction terminal 16′. The transistor 11′ is a PNP type junction type transistor poled for easy flow of the discharge current of capacitor 12. The transistor 11 has its base 20' connected to ground and its emitter 22' coupled to the base 19' of the unijunction transistor 10'. In view of the reversed bias requirements of transistor 11', a new source 27 of negative potentials is provided. The collector 21' of the transistor 11' is connected through the resistance 15' to the negative terminal of source 27. The positive terminal of this source is coupled to ground bus 17. The remaining connections are substantially as in the embodiment of FIGURE 1.

The arrangement set forth in FIGURE 2 functions in largely the same manner as that explained with respect to FIGURE 1. The emitter input connection of the transistor 11' has a substantially lower input impedance than the base input configuration of transistor 11 of FIGURE 1. If a comparison of input impedances is made, the emitter input connection may often be a fraction of 100 ohms while that of the base input connection may be several hundred ohms. Accordingly, somewhat higher rise times may be achieved in the arrangement of FIGURE 2. The arrangement provides appreciable voltage gain by virtue of the voltage amplifying action of the transistor 11'. The output of the oscillator of either FIGURE 1 or 2 may be coupled to a utilization device of moderately high impedance, a typical value usually being on the order of 1000 ohms.

The arrangement set forth in FIGURE 3 provides a third configuration in which a junction transistor may be connected with a unijunction transistor for effective waveform generation. In FIGURE 3, the silicon PN unijunction transistor 28 is provided having one base 29 coupled through resistance 40 to the positive terminal of the source 30. The other base 31 of the unijunction transistor 28 is coupled to ground as is the negative terminal of the source 30. The NPN transistor 32 associated with the unijunction transistor 28 has its base electrode 33 grounded and its emitter 34 coupled to one terminal of the capacitor 35. The other terminal of the capacitor 25 is coupled to the junction electrode 36 of the unijunction transistor 28. The collector electrode 37 of the transistor 32 is connected by means of the resistor 38 to the positive terminal of the source 30. The output terminal 23 of the pulse generating network is also connected to the collector electrode 37. A capacitor charging resistance 39 is provided coupled between the base 29 and the positive terminal of source 30.

The foregoing parts function similarly to the manner described with respect to the preceding figures. However, in this embodiment the capacitor 35 is charged during the onset of a pulse by the source 30 through a circuit path including the resistor 39 and the input junction (now reversed) of the transistor 32. The constant current property of a junction through which current is reversely passed thus acts to stabilize the charging rate of capacitor 35 and thus increases the timing accuracy of the circuit. At the moment that the capacitor attains the firing potential, the unijunction transisor 28 fires, causing the capacitor 35 to be discharged through a circuit including the junction electrode terminal 36, the base electrode 31 and the input circuit of the transistor 32. Since both the transistor and unijunction junctions are operating in a forward direction, the rate of discharge is extremely rapid, and the sudden pulse of discharge current appears as a negative going pulse at the output of the pulse oscillator. The output waveform of the embodiment of FIGURE 3 is at 25. As before, the transistor provides a very efficient low impedance path for the discharge current of the capacitor 35 at the moment of unijunction breakdown and an efficient load while at the same time providing both an amplifying effect (in this case a voltage gain) and effective isolation of the unijunction device from the load.

The invention has so far been described in applications wherein the wave generating networks are self-oscillatory. The invention may also be applied to wave generators wherein an external means is used to drive the generator.

While particular embodiments of the invention have been shown and described, it should be recognized that the invention is not limited thereto and it is intended in the appended claims to claim all variations as fall in the true spirit of the present invention.

What I claim as new and desire to secure by Letters Patent of the United States is:

1. A wave generator comprising a unijunction transistor having a rectifying junction and exhibiting a negative resistance characteristic, a source of direct potentials, a capacitor coupled to said source by means providing for the charging thereof, a junction transistor having an input junction, means connecting said unijunction rectifying junction and said transistor input junction in series in the easy flow direction in a path between the capacitor terminals for the recurrent discharge thereof, and means for applying bias potentials across the two bases of said unijunction transistor and across the output junction of said junction transistor.

2. A wave generator comprising a unijunction transistor having a rectifying junction and exhibiting a negative resistance characteristic, a source of direct potentials, a capacitor coupled to said source by means providing for the charging thereof, a junction transistor having an input junction and an output junction, means connecting said unijunction rectifying junction and said transistor input junction in series in the easy flow direction in a path between the capacitor terminals for the recurrent discharge thereof, means coupled to said transistor output junction for deriving an output waveform, and means for applying bias potentials across the two bases of said unijunction transistor and across the output junction of said junction transistor.

3. A wave generator comprising a unijunction transistor having a junction terminal and two ohmic contacts and exhibiting a negative resistance characteristic, a source of direct potentials, a capacitor coupled to said source by means providing for the charging thereof, a junction transistor having an input and an output junction, means for recurrently discharging said capacitor in a path including in the order recited said junction terminal, one of said ohmic contacts and said transistor input junction, both junctions being poled in the direction of easy flow for said discharge current, means coupled to said transistor output junction for deriving an output waveform, and means for applying bias potentials across the two bases of said unijunction transistor and across the output junction of said junction transistor.

4. The combination set forth in claim 3 wherein said unijunction transistor is of the PN type and said junction transistor is of the NPN type, said one ohmic contact being coupled to the base electrode of said junction transistor.

5. The combination set forth in claim 3 wherein said unijunction transistor is of the PN variety and said junction transistor is of the PNP variety, said one ohmic contact being connected to the emitter of said transistor.

6. A wave generator comprising a unijunction transistor having a junction terminal and two ohmic contacts and exhibiting a negative resistance characteristic, a source of direct potentials having one terminal coupled to one of said ohmic contacts, a capacitor coupled to said source by means providing for the charging thereof, said capacitor also having one terminal coupled to the junction terminal of said unijunction transistor, a junction transistor having an input and an output junction, said input junction being connected between said other ohmic contact and the other terminal of said source and poled in a direction for the easy flow of discharge current from said capacitor, means coupled to said transistor output junction for deriving an output waveform, and means for applying bias potentials across the two bases of said unijunction transistor and across the output junction of said junction transistor.

7. A wave generator comprising a source of direct potentials, a capacitor coupled to said source by means providing for the charging thereof, means for recurrently discharging said capacitor including a unijunction transistor having a junction and exhibiting a negative resistance characteristic and a junction transistor having input and output junctions, the discharge path for said capacitor including said unijunction junction and the input junction of said transistor poled for easy flow of said discharge current, means coupled to said transistor output junction for deriving an output waveform, and means for applying bias potentials across the two bases of said unijunction transistor and across the output junction of said junction transistor.

References Cited in the file of this patent

UNITED STATES PATENTS

| | | |
|---|---|---|
| 2,769,907 | Lohman | Nov. 6, 1956 |
| 2,780,752 | Aldrich et al. | Feb. 5, 1957 |